United States Patent [19]

Ogawa

[11] Patent Number: 4,824,766
[45] Date of Patent: * Apr. 25, 1989

[54] PATTERN FORMING METHOD

[75] Inventor: Kazufumi Ogawa, Hirakata, Japan

[73] Assignee: Matsushita Electric Industrial Co., Ltd., Osaka, Japan

[*] Notice: The portion of the term of this patent subsequent to Jun. 14, 2005 has been disclaimed.

[21] Appl. No.: 30,612

[22] Filed: Mar. 27, 1987

Related U.S. Application Data

[63] Continuation of Ser. No. 751,256, Jul. 2, 1985, Pat. No. 4,751,171.

[30] Foreign Application Priority Data

Jul. 3, 1984 [JP] Japan .................. 59-138155
Oct. 16, 1984 [JP] Japan .................. 59-216641
Dec. 10, 1984 [JP] Japan .................. 59-259327

[51] Int. Cl.$^4$ .............. G03F 7/16; G03F 7/26
[52] U.S. Cl. .................. 430/299; 430/296; 430/323; 430/324; 430/326

[58] Field of Search ............ 430/281, 286, 287, 288, 430/291, 296, 299, 323, 324, 326, 331

[56] References Cited

U.S. PATENT DOCUMENTS

| | | | |
|---|---|---|---|
| 3,652,274 | 3/1972 | Verelst et al. | 430/287 |
| 3,936,307 | 2/1976 | Asakawa et al. | 430/334 |
| 4,301,231 | 11/1981 | Atarashi et al. | 430/296 |
| 4,374,193 | 2/1983 | Moriya et al. | 430/149 |
| 4,439,516 | 3/1984 | Cernigliaro et al. | 430/323 |
| 4,507,384 | 3/1985 | Morita et al. | 430/287 |
| 4,564,572 | 1/1986 | Saigo et al. | 430/288 |

Primary Examiner—Richard L. Schilling
Attorney, Agent, or Firm—Wenderoth, Lind & Ponack

[57] ABSTRACT

A method of forming any film pattern on an arbitrary substrate, more particularly, a pattern forming method which comprises selectively forming a film on an arbitrary substrate, by use of chemical reaction, and further, a method of forming a pattern of an organic film by selectively removing the organic film at a lower layer, with the pattern of the Langmuir-Blodgett's film containing Si as a mask.

10 Claims, 8 Drawing Sheets

PATTERN FORMING METHOD

This application is a continuation of Ser. No. 751,256 filed July 2, 1985, now U.S. Pat. No. 4,751,171.

BACKGROUND OF THE INVENTION

The present invention relates to a pattern forming method which can be used in manufacture of semiconductor elements, printing plates etc., and particularly relates to a pattern forming method for selectively forming a film on an arbitrary substrate by use of chemical reactions.

Heretofore, resist patterns in the manufacture of semiconductor elements or resin patterns which provide negative plates in the manufacture of printing plates have been manufactured in the following manner: A resin film which may be polymerized or decomposed by irradiation of light is formed on the substrate and, then, light beams are irradiated in any arbitrary pattern on the resin film, followed by development, thereby forming the pattern. More and more refining of these resist patterns has become demanded for attainment of higher density of semiconductor elements and higher quality of printed forms.

Particularly, in the manufacture of very large scale integrated circuit (VLSI), there has arisen the need for forming at a high accuracy a resist pattern in fine lines of submicron order. While this process is largely affected by the physical properties of the resist itself, generally, the finer the pattern it is desired to have (thus, for increasing the resolution), the resist film applied needs to thinner. On the other hand, when it comes down to providing submicron patterns, wet etching can not be utilized, but such a dry etching as ion etching, plasma etching or sputter etching, etc., must be utilized. In order to improve the dry etching resistance of the resist pattern, generally, the resist coating needs to be thick.

Accordingly, in order to meet the above-stated two requirements, it is advisable to develop a photoresist whose coating is thick, but gives high resolution, or a photoresist whose coating is thin but gives high dry-etching resistance. However, presently, there is available no such material.

On the other hand, heretofore, resist patterns used in manufacturing integrated circuits (IC) are generally formed in the following manner: The photoresist is applied on a semiconductor substrate by use of a rotary coating device using a spinner and the substrate is exposed in a specified pattern, followed by development, thereby forming the resist pattern. Recently, to fill the need of fine pattern forming in manufacturing VLSI, forming a resist pattern which is highly accurate in pattern dimensions and which moreover, has no pin-hole is desired. However, generally, when the method of applying the photoresist by the rotary coating is used, if the semiconductor substrate which forms the base has any stepped parts, the film thickness of the photoresist becomes irregular, thus the coating being thinner at the top of each convex part, but thicker at the bottom of each concave part. Therefore, even if the exposure is made with a photo-mask having an equal line width, the line widths of the pattern differ between that at the top of the convex part and that at the bottom of the concave part. Furthermore, to achieve the pattern of the order of 0.5–1 μm at a high accuracy as in manufacturing VLSI, the thickness of the photoresist coating needs to be reduced. However, taking account of etching resistance and prevention of pin-hole when applying the coating, the film thickness needs to be larger than a certain value and due to this coating thickness, there is a limitation in the forming of the fine pattern.

Further, as a method of forming thin film having no pin-hole, a forming method of very thin photoresist film using the Langmuir Blodgett's technique (hereinafter referred to as LB technique) is in the process of development. However, by this method, the pattern can be obtained at a high accuracy, but since the coat thickness of one layer is on the order of 20–30Å, normally about 100 layers need to be formed in order to resist the plasma etching in manufacturing IC.

SUMMARY OF THE INVENTION

It is the object of this invention to provide a method for forming a pattern which has high resolution and excellent etching resistance.

This and other objects will be accomplished by a pattern forming method which comprises a step of forming on a substrate a responsive film containing responsive groups which undergo chemical reactions when exposed to energy beams (electron beam, ion beam, light, X-ray, etc.), a step of selectively deactivating parts of the responsive groups by irradiating such energy beams in a pattern, and a step of bonding chemical reagent to the parts of the responsive film where the responsive groups remains, thereby forming a resin film of an ultra-fine pattern.

In a specific embodiment, as the chemical reagent, there are employed molecules having at one end thereof groups which are adapted to react with the responsive groups or such responsive groups which are modified and having at the other end thereof responsive groups which perform the same action as the responsive group does. By repeating a plural number of times the process of selectively bonding the chemical reagent, the thickness of the patterned resin film is increased or further, the dry-etching resistance is improved by having atoms high in the dry-etching resistance contained in the molecule to be bonded with the underlying film.

Further, in another specific embodiment, used as the means for forming the responsive film is the Langmuir Blodgett's technique or the chemical adsorption method. By cumulatively forming monomolecular film layers in such a way that the energy beams responding groups are juxtaposed and laid bare on the substrate surface, not only improvement in sensitivity but the forming of ultra-fine pattern are made possible.

In still another embodiment, on the substrate, the above-described pattern forming is performed, with an organic film interposed therebetween and further, with this pattern as the mask, parts of the organic film at the lower layer are etched away, thereby transferring the pattern to the organic film. Used as the chemical reagent, are chain siloxane molecules having chlorine at both ends thereof. Using a substrate whose surface is hydrophilic and as the responsive film, straight chain hydrocarbons having vinyl or cyano group at one end thereof and chlorosilane group at the other end thereof, monomolecular responsive film is formed on the substrate surface by chemical adsorption reaction such that the responsive groups are juxtaposed and laid bare on the substrate surface. The responsive film may be formed by the LB technique, using straight chain hydrocarbons having such a hydrophilic group as silanol group, etc., in place of chlorosilane group. A step of turning the surface hydrophilic by way of plasma treatment or coating or absorption, etc., of a surface active agent may be included, when a substrate whose surface is hydrophobic is used. A responsive film is formed on an arbitrary substrate, interposed by an organic film, siloxane molecules are selectively bonded to this film and, thereafter, through oxygen plasma treatment, the pattern formed by siloxane molecules is transferred to the organic film. A step of substituting with hydroxyl group the chlorine at one end of each remaining siloxane molecule after the bonding reaction and a step of further subjecting straight chain siloxane molecules having chlorine bonded at both ends to a bonding reaction with the hydroxyl groups are performed more than once.

Further, the present invention relates to a pattern forming method on an arbitrary substrate characterized by a step of forming a sensitive LB film containing Si, with an organic film interposed therebetween, a step of forming a pattern of the LB film by selectively polymerizing or decomposing the sensitive LB film by irradiation of energy beams, followed by development, and a step of selectively etching the organic film by means of plasma containing oxygen, with the pattern of the LB film as the mask.

More particularly, on the substrate surface to be subjected to etching process, preliminarily, any sharp stepped parts are eliminated, an organic film is formed to a thickness of the order usable as the etching resist and further, on top of it, several layers of sensitive LB film containing Si are formed by the LB technique. Thereafter, the LB film is selectively exposed to light, electron beam, ion beam, X-ray, etc., followed by development, thereby first forming the pattern of LB film and with this LB film pattern as the mask, the organic film at the lower layer is selectively etched, thereby forming the etching resist pattern for forming the base.

This invention has various advantages, among which is its capability of forming the pattern at a high resolution and with excellent etching resistance.

While the novel features of the invention are set forth with particularity in the appended claims, the invention, both as to its organization and content, will be better understood and appreciated, along with other objects and features thereof from the following detailed description taken in conjunction with the drawings.

DETAILED DESCRIPTION OF THE INVENTION

Figure 1A:
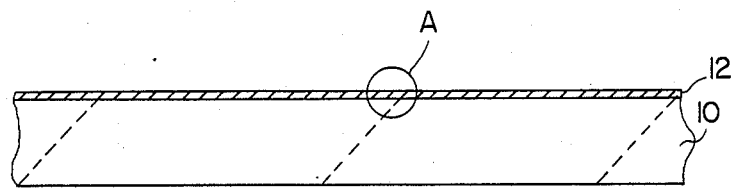
FIGS. 1 (*a*)–(*h*) are sectional views showing the steps of a first embodiment for explanation of the method of this invention, (*a*), (*c*), (*e*) and (*g*) of this figure representing conceptual views of section of the substrate in the successive steps, and (*b*), (*d*), (*f*) and (*h*) of this figure expanded views at the molecular scale level of the parts A-D indicated in (*a*), (*c*) (*e*) and (*g*), respectively.
Figure 1B:
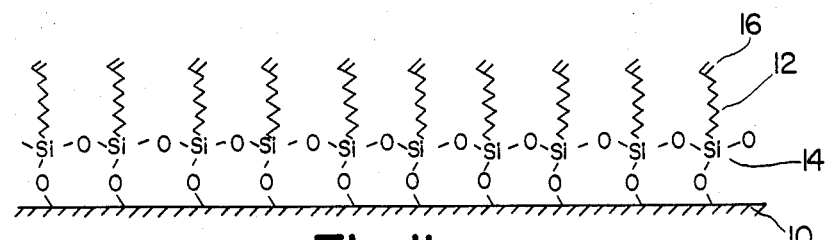
Figure 1C:
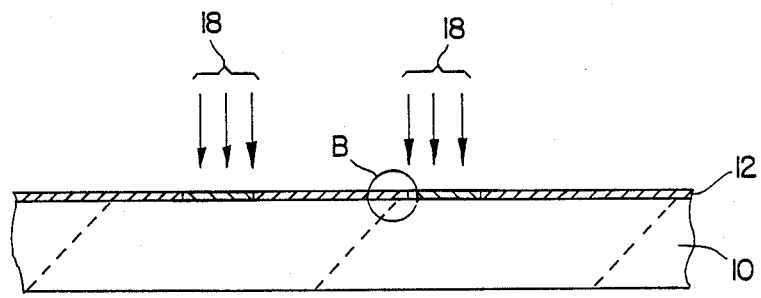
Figure 1D:
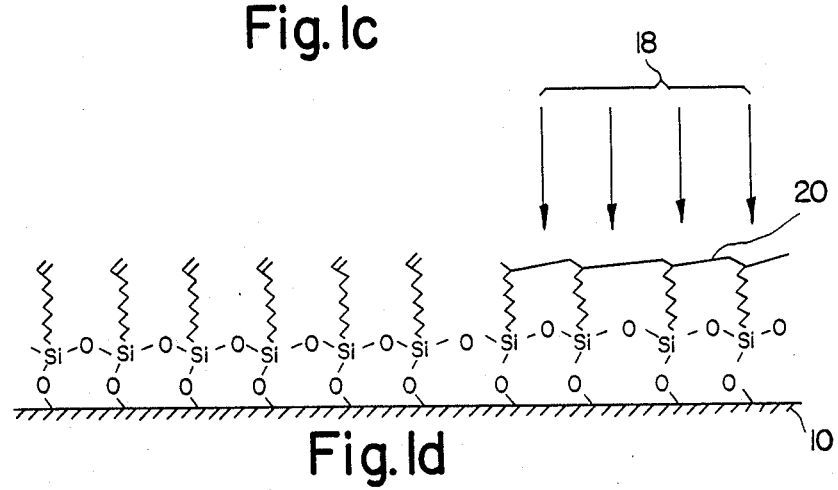
Figure 1E:
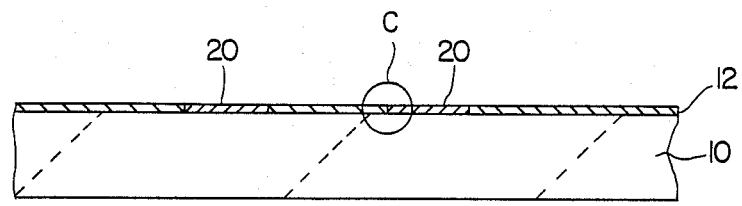
Figure 1F:
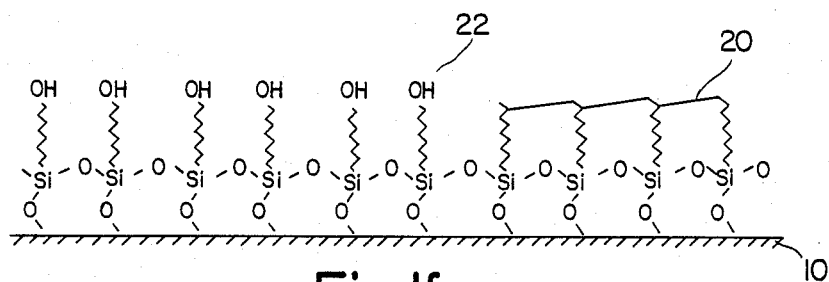
Figure 1G:
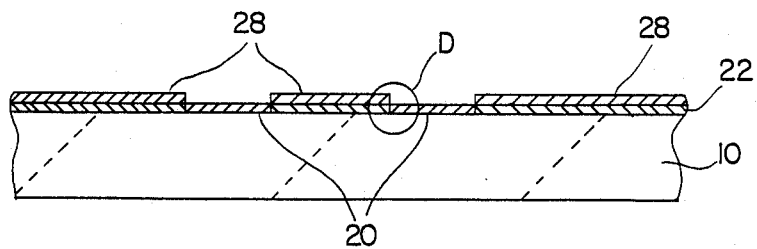
Figure 1H:
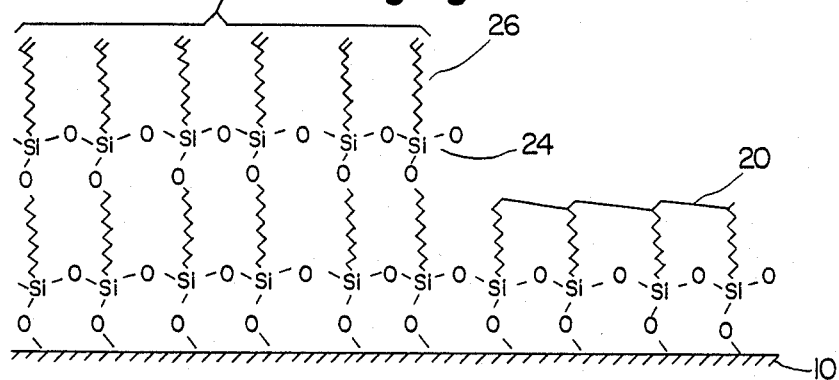

In the following, embodiments of the pattern forming method of this invention are described with reference to FIGS. 1–6.

(Embodiment)

A first embodiment of this invention is described with reference to FIG. 1. On a Si substrate 10 formed with SiO$_2$, there is formed by chemical adsorption process, a monomolecular film 12 of

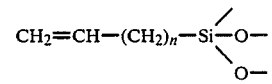

through the reaction with surface of silane surface active agent, e.g., CH$_2$=CH—(CH$_2$)$_n$—SiCl$_3$ (n represents an integer, preferably being 10-25). For example, the treated substrate is dipped in a solution of this surfactant at its concentration of $2.0 \times 10^{-3} - 5.0 \times 10^{-2}$ mol/l in 80% n-hexane, 12% tetrachloromethane and 8% chloroform, to form a bonding 14 of

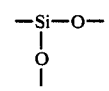

the SiO$_2$ surface [FIG. 1 (*a*)].

Now, the vinyl groups 16 of the silane surface active agent are juxtaposed on the substrate surface forming a film [FIG. 1 (*b*)], and will undergo polymerization reaction among surrounding vinyl groups under irradiation by electron beams. Accordingly, electron beams 18 are irradiated onto the surface in a pattern, as shown in FIG. 1 (*c*). Then, as shown in FIG. 1 (*d*), the double bonds of the vinyl groups at the parts 20 which are irradiated by electron beams are mutually combined to be selectively deactivated.

Then this substrate is dipped in 1 mol/l THF solution of diborane and further immersed in an aqueous solution having 0.1 mol/l of NaOH and 30% H$_2$O$_2$, thereby adding hydroxyl groups 22 to unirradiated vinyl groups [FIGS. 1 (*e*) and (*f*)].

Thereafter, further CH$_2$=CH—(CH$_2$)$_n$—SiCl$_3$ is set to react with hydroxyl groups 22 similarly as above described, thereby forming the bonding 24 of

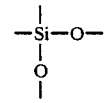

[FIG. 1 (*h*)]. Thus by this process, one layer of the molecule of

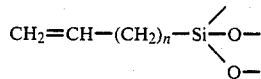

is selectively combined, yielding the film pattern 28.

In the following, there is shown how an ultrafine pattern 28 of the necessary thickness of about 30-300A of cumulated layers of silane surface active agent is formed by repeating the step of adding hydroxyl groups 22 to the vinyl groups of the silane surface active agent 12 formed in juxtaposed arrangement and the step of further adding another layer of silane surface active agent 26.

It should be noted that while in the above described examples, a substrate which forms

bonding by reaction with —SiCl₃ of the silane surface active agent, that is, a Si substrate 10 formed with SiO₂, is used as an example, besides it, such inorganic substances as Al₂O₃, glass, etc., and such organic substances as polyvinyl alcohol, etc., are usable as the substrate.

When the substrate surface is coated with some other water repellent substance, hydrophilic groups are arranged side by side with each other on the overall surface of the substrate by forming the LB film or the method of turning the substrate surface hydrophilic by way of O₂ plasma treatment, etc. Although the adhesive power is low in the LB film, even if the substrate surface material is water repellent, by halting the cumulation at a layer where the water repellent surface is formed on the substrate side, it is possible to completely turn the surface hydrophilic.

On the other hand, when the substrate is subjected to O₂ plasma treatment, its surface is oxidized to be hydrophilic.

(EMBODIMENT 2)

Figure 2A:
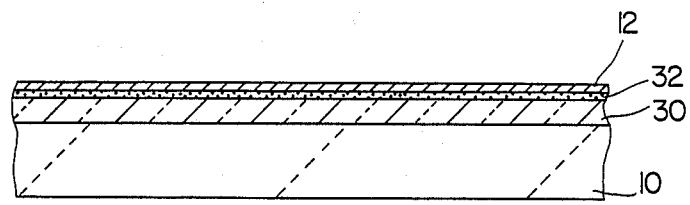
FIGS. 2 (*a*)–(*c*) are sectional views showing the steps of the second embodiment of this invention, conceptual diagrams for explanation of the steps of transferring the pattern to the organic film, following the process of a first embodiment.
Figure 2B:
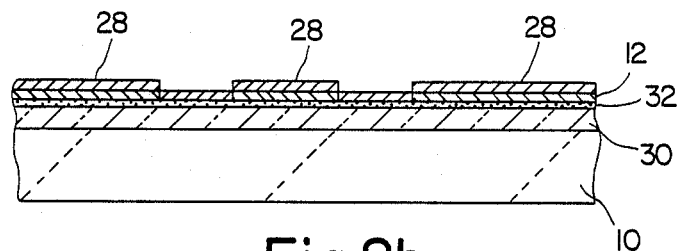
Figure 2C:
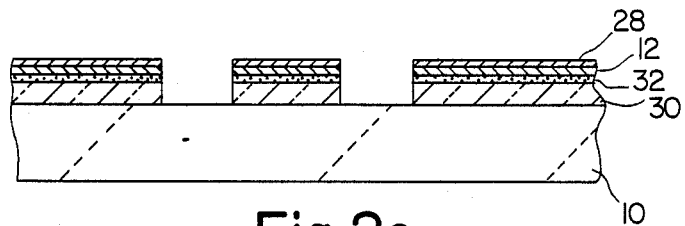
Figure 3A:
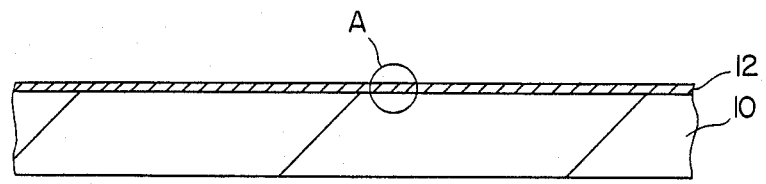
FIGS. 3 (*a*)–(*h*) are sectional views showing the steps of the pattern forming method of a third embodiment, (*a*), (*c*), (*e*) and (*g*) of this figure being sectional views of the substrate, and (*b*), (*d*), (*f*) and (*h*) respectively expanded views of parts A, B, C and D indicated in (*a*), (*c*), (*e*) and (*g*)
Figure 3B:
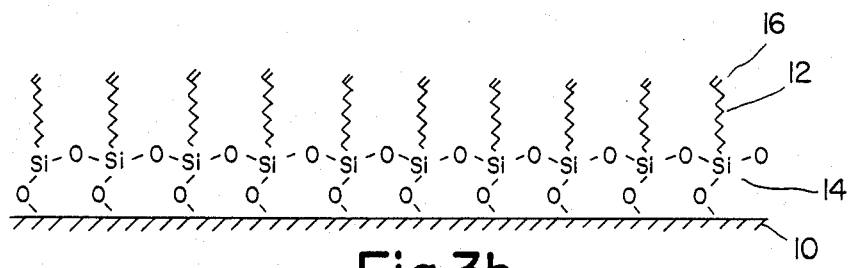
Figure 3C:
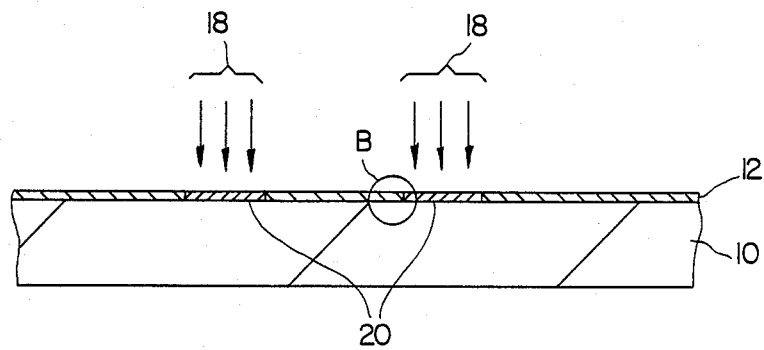
Figure 3D:
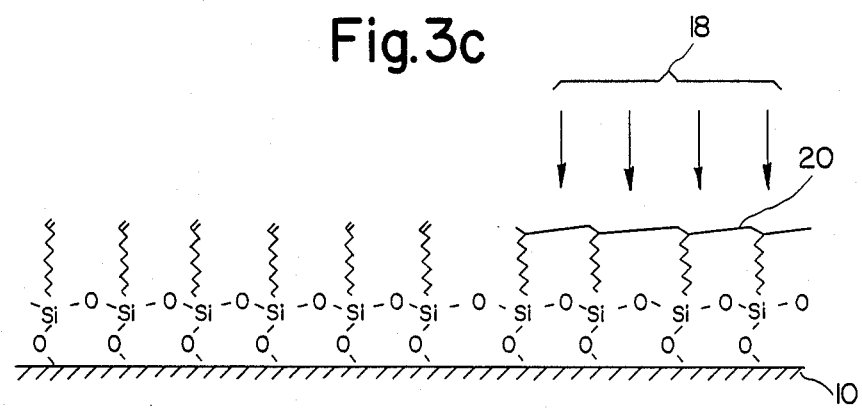
Figure 3E:
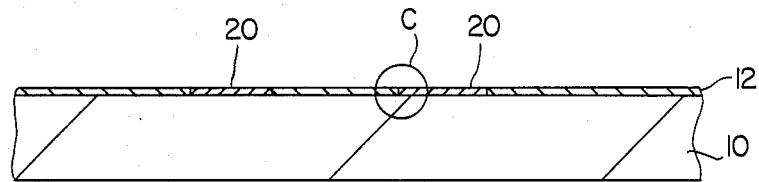
Figure 3F:
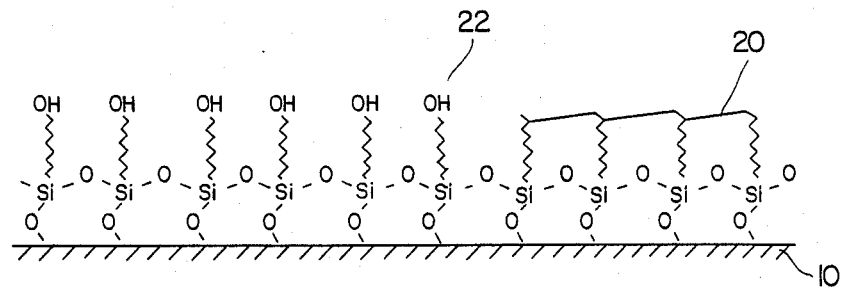
Figure 3G:
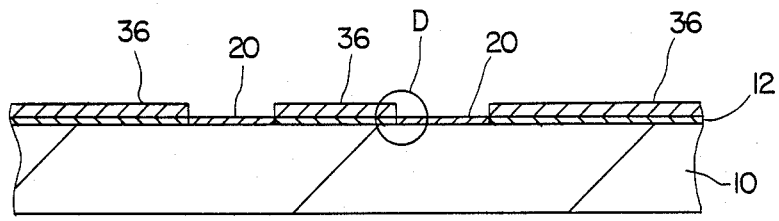
Figure 3H:
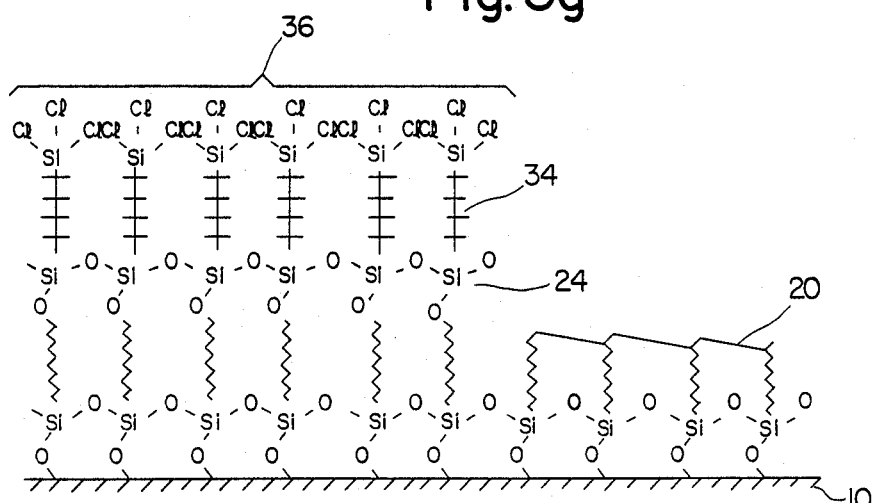

For example, as shown in FIG. 2, on the substrate 10, an organic film, e.g., a rubber base resist layer 30, is applied and on this surface, a layer 32 subjected to O₂ plasma treatment (e.g., at 0.01 Torr and 100W for about 30 sec) is formed; thereafter, silane surface active agent is absorbed on the resist surface in the similar way as in the above-stated embodiment, thereby forming a monomolecular film 12 [FIG. 2 (a)].

Then the similar steps are repeated just as in Embodiment 1, thereby forming a pattern 28 made up of a surface active agent containing Si [FIG. 2 (b)]. Thereafter, this treated substrate is subjected to a plasma treatment in CF₄ gas with 10% O₂ added and with the pattern 28 as the mask, whereby the sensitive film containing Si which has been deactivated beforehand is selectively removed. Then the pattern 28 of the surface active agent may be transferred to the photoresist layer 30 by etching the resist 30 with O₂ plasma, with the pattern of the surface active agent containing Si as the mask [FIG. 2 (c)]. In this instance, a rubber base resist layer was used as the organic film; however, whatever material which may be etched by O₂ plasma is obviously usable. The pattern of the surface active agent containing Si which tends to form SiO₂ has the advantage of ensuring adequate etching resistance against O₂ plasma without using substantially thick cumulative film layers. On the other hand, after the pattern has been transferred to the photoresist layer, since the photoresist layer may be made adequately thick, this pattern is utilizable as an ultra-fine resist pattern having adequately large etching resistance against dry-etching (e.g., ion etching or sputter etching) which is generally employed in the manufacturing process of VLSI.

In the above two embodiments, a method of performing adsorbing reaction with silicon surface active agent as the responsive film is illustrated, but if the reagent with its —Cl substituted with —OH beforehand (CH₂=CH—(CH₂)ₙ—Si(OH)₃, etc.) is used, the responsive film may be formed by the LB technique.

According to Embodiments 1 and 2, forming of ultra-fine pattern is possible, since the energy beam responsive film is formed of single to several layer monomolecular cumulative film. Further, by conducting the selected film growing reaction through reaction between —SiCl₃ and —OH groups, a pattern having large oxygen dry-etching resistance may be obtained. Accordingly, when the organic film is utilized as the lower layer, the pattern transfer to the organic film by oxygen dry-etching is easy.

The LB technique and the adsorption method for use in forming the responsive film, which permits the film formation to proceed through intersurface reaction with the substrate surface, are not substantially affected by stepped parts of the substrate and, therefore, they are enormous effects, when utilized for substrates involving many stepped parts as on VLSI elements.

In the Embodiments 1 and 2, intersurface reaction between —SiCl₃ and —OH is taken up as an example, but any other materials, if they function with similar mechanism, are usable. Accordingly, the method of this invention is highly effective in improving the formation of ultra-fine pattern, especially, the photolithographic process in the manufacture of VLSI, etc.

The method of this invention will hereafter have applications as a molecular device manufacturing technique by utilizing reagents containing molecules which form π-conjugate polymers, for example, such functional molecules as —C≡C—C≡C—, —C₆H₄—, —C₄NH₃—, —C₄SH₂—. —C₆H₄—CH=CH—, —C₆H₄—S—, —C₆H₄—O—, etc., between straight chain CH₂ bonding inside the molecules of silane surface active agents shown in the above-stated embodiments or as their side chains.

(EMBODIMENT 3)

A third embodiment of this invention is described with reference to FIG. 3.

Referring to (a) of this figure, on the Si substrate 10 formed with SiO₂, a silane surface active agent [for example, CH₂=CH—(CH₂)ₙ—SiCl₃ (n being any integer, from 10 to 20)] is set to react with the surface of the substrate 10 by the chemical adsorption method, thereby forming a monomolecular film 12 of

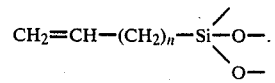

For exampe, this substrate is dipped in a solution of this agent at a concentration of from 2.0×10⁻³ to $5.0 \times 10^{-2}$ mol/l in 80% n-hexane, 12% tetrachloromethane and 8% chloroform, thereby forming a bonding 14 of

on the SiO$_2$ surface. Now, as shown in FIG. 3 (b), the vinyl groups 16 are juxtaposed on the substrate surface forming a film. Then, to take advantage of the polymerization reaction between surrounding vinyl groups induced by irradiation of electron beams, the electron beams 18 are irradiated in a pattern, as shown in FIG. 3 (c). Thereby the double bonds of the vinyl groups of the parts 20 which have been irradiated by the electron beams are combined with each other, as shown in FIG. 3 (d), thus effecting selective deactivation.

Next, as shown in FIGS. 3 (e) and (f), the thus treated substrate is dipped at room temperature in 1 mol/l THF solution of diborane and further immersed in an aqueous solution of 0.1 mol/l NaOH and 30% H$_2$O$_2$, thereby adding hydroxyl groups 22 to the unirradiated parts of vinyl groups.

Thereafter, as shown further in FIGS. 3 (g) and (h), chemical substances, for example, straight chain siloxanes (hereinafter referred to as siloxane molecules) having chlorine bonded at both ends, as represented by

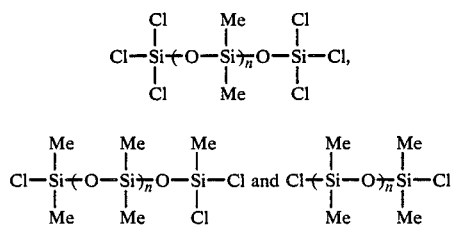

(where n designates an interger), etc., may be used in forming the bonding of

through reaction with hydroxyl groups 22 similarly as abovedescribed. Thus by this process, a film pattern 36 is formed of siloxane molecules 34 selectively bonded in layers with the substrate 10.

Thereafter, by repeating the step of hydrolyzing

(chlorosilane groups) formed side by side with each other on the surface of the substrate, thereby converting them into

(silanol groups), and the step of adding the siloxane molecules thereto, siloxane molecules providing the necessary thickness are cumulated (to a thickness from several tens Å to several hundreds Å) and formed in an ultra-fine pattern.

It should be noted that in the Embodiment 3, a substrate whose surface is hydrophilic, as it tends to form the

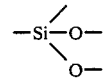

bonding by reaction with —SiCl$_3$ of the surface active agent, or Si substrate formed with SiO$_2$ is taken up as an example, but other materials such as Al$_2$O$_3$, glass or other inorganic substances and polyvinyl alcohol or other organic substances are utilizable. On the other hand, if the substrate surface is coated with other materials which show water repellency, it is possible to provide hydrophilic groups side by side with each other all over the substrate surface by forming the LB film or to turn the substrate surface hydrophilic by way of O$_2$ plasma treatment, etc., or to use the method of coating or adsorbing some surface active agent on the surface. Although the LB film is poor in adhesive power, even when the substrate surface material is water repellent, if the cumulation process is halted at a layer where the water repellent surface is brought to the substrate side, it is possible to turn the surface completely hydrophilic.

When the substrate surface is subjected to the O$_2$ plasma treatment, it will be oxidized to exhibit hydrophilic property. As energy beam responsive groups, acetylene groups or cyano groups may be used other than said vinyl groups.

In contrast, a responsive film having energy beam responsive groups is subjected to pattern irradiaion in a gas atmosphere, thereby partially converting them into active groups which are reactive with siloxane molecules to be introduced in the later process. For example, there is available a method of adding the siloxane molecules after activating the responsive film in a pattern by directly adding hydroxyl groups to its vinyl groups by way of irradiation of electron beams in the pattern in an atmosphere of O$_2$ gas or H$_2$O gas.

(EMBODIMENT 4)

In the fourth embodiment, the method exercised in the third embodiment is applied on a substrate on which an organic film is formed and the pattern formed by the third embodiment is transferred to the organic film.

Figure 4A:
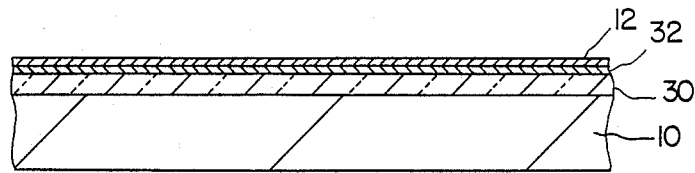
FIGS. 4 (*a*), (*b*), and (*c*) are sectional views showing the steps of the pattern forming method of a fourth embodiment of this invention.
Figure 4B:
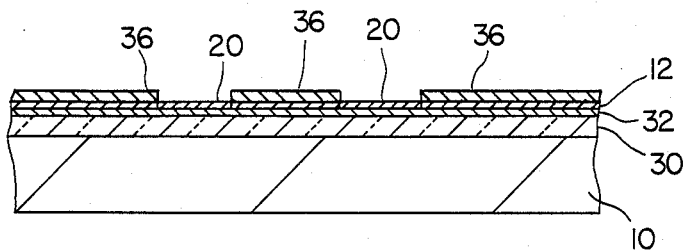
Figure 4C:
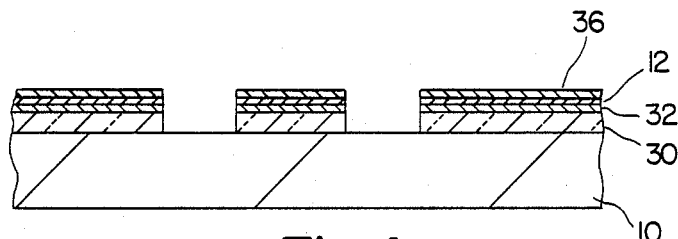

FIG. 4 shows this embodiment. As shown in (a) of this figure, an organic film, e. g., a rubber base resist 30, is applied on the substrate 10, on top of which a layer 32 subjected to a plasma treatment (e. g., for 30 sec at 0.01 Torr and 100W) is formed and the silane surface active agent is adsorbed on the resist surface by the same method as that of the third embodiment. Next, the similar process as that of the third embodiment is repeated, to produce the pattern 36 formed of the surface active agent containing Si, as shown in FIG. 4 (b); thereafter, by etching $O_2$ plasma resists 30 and 32 with the pattern 36 of the surface active agent containing Si as the mask, as shown in FIG. 4 (c), it is possible to transfer the pattern of the surface active agent to the photoresist. In this instance, as the organic film, a rubber base resist was used, but any materials which are etchable by $O_2$ plasma are usable. The pattern of the surface active agent containing Si which forms $SiO_2$ under exposure to $O_2$ plasma is advantageous, since adequate etching resistance may be secured without making the cumulated film very thick. On the other hand, as the pattern is transferred to the photoresist, which may be formed adequately thick, the photoresist may be utilized as an ultra-fine resist pattern which shows adequate etching resistance to dry-etching (e.g., ion etching or sputter etching) which is generally employed in the manufacturing process of VLSI.

It should be noted that while in the third and fourth embodiments, as a method of forming the responsive film, adsorption reaction of the silicon surface active agent is illustrated, by using a reagent in which —Cl has been substituted by —OH group beforehand [$CH_2=CH-(CH_2)_n-Si(OH)_3$, etc.], a responsive film may be formed even by the LB technique.

Since according to the third and the fourth embodiments, the energy beam responsive film is formed as a from single to several layer monomolecular molecular cumulated film, forming of ultra-fine pattern is possible. Further by making the selective film growth by way of adding reaction of siloxane molecules, a pattern having large dry-etching resistance is obtained. Accordingly, when an organic film is utilized as the lower layer, the pattern transfer to the organic film by oxygen dry-etching is easy.

With the LB technique and the chemical adsorption process which are utilized for forming the responsive film on the principle that the selective growth of the film is advanced by the inter-surface reaction with the substrate surface, the stepped parts of the substrate are not substantially affected. Therefore, they have enormous effects, when applied to substrates involving many stepped parts as on VLSI elements.

It should be noted that although the third and fourth embodiments illustrate intersurface reaction between —SiCl and —OH, any materials are usable which work on the similar reaction mechanism. Accordingly, the method of this invention is effective in improving the formation of ultra-fine pattern, especially in the photolithographic process in the manufacture of VLSI, etc.

It should be further noted that the method of this invention may be applied as a molecular device manufacturing technique by utilizing reagents containing functional molecules, for example, molecules which are adapted to form $\pi$—conjugate polymers of —C≡C—C≡C—, —$C_6H_4$—, —$C_4NH_3$—, $C_4SH_2$—, —$C_6H_4$—CH≡CH—, —$C_6H_4$—S—, —$C_6H_4$—O—, etc., between straight chain $CH_2$ bonding inside the silane surface active agent molecule shown in the above-stated embodiments or as its side chains.

(EMBODIMENT 5)

As shown in FIG. 5, an organic film 42 is coated on an arbitrarily irregular surface of substrate 40 of a semiconductor, etc. At this time, it is only proper that the coating is thick enough to round the steep stepped parts of the base substrate and to resist the etching, while being done on the base substrate; it is not always necessary to apply it on the substrate surface until it becomes flat. Nor does the organic film 42 need to be sensitive to light.

Figure 5A:
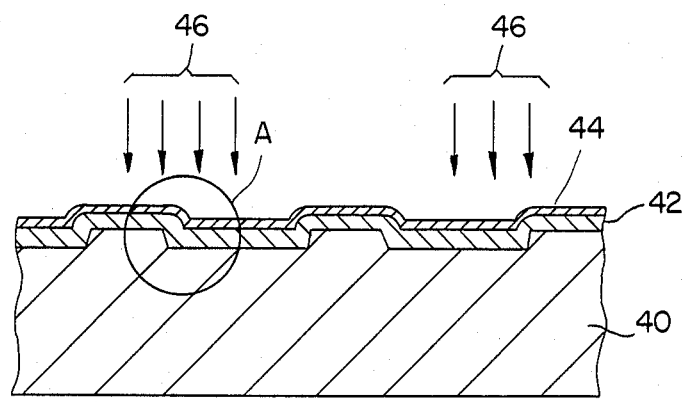
FIGS. 5 (*a*)–(*c*) are sectional views showing the steps of the pattern forming method of a fifth embodiment of this invention.
Figure 5B:
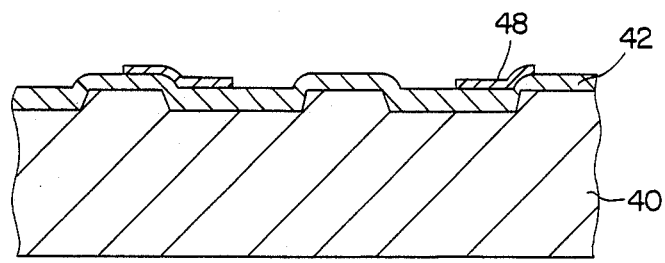

Then by the LB technique, several layers of sensitive LB film containing Si are formed and are, then, selectively polymerized or decomposed by means of energy beams 46 such as light, electron beam, iron beam, X-ray, etc., (FIG. 5a) followed by development, thereby forming the LB film pattern 48 containing Si (FIG. 5b). At this time, usable as the LB film materials containing Si are such compounds as w-tricosenoic acid, diacetylene monocarboxylic acid, 2-hexadecenoic acid, $\alpha$-octadecyl acrylic acid and octadecyl metacrylate, etc., of which the straight chain carbons are partly substituted by Si's.

Figure 5C:
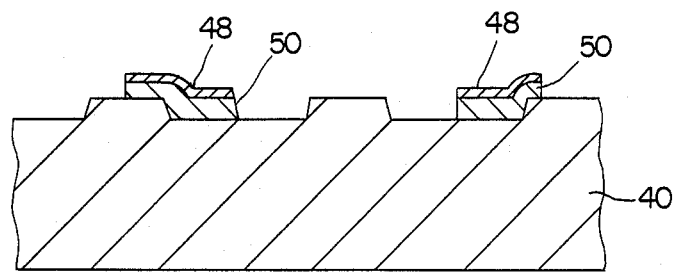
Figure 6:
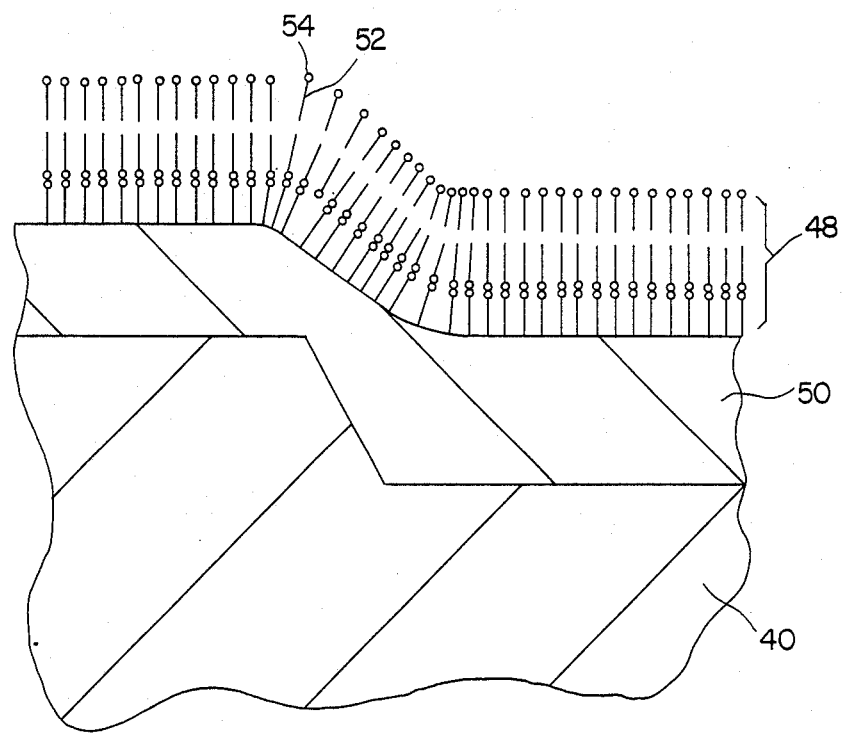
FIG. 6 is a sectional view showing an expanded sectional view of the part A in FIG. 5 and being a view for explanation of the structure of the LB film.

Then, by treating the treated substrate in a plasma containing oxygen such as $O_2$ plasma, etc., with the LB film pattern 48 containing Si as the mask, the organic film 42 is selectively etched, thereby forming an organic film pattern 50 (FIG. 5c). It should be noted that at this time, since the LB film contains Si, its resistance to $O_2$ plasma etching is large; that is, the surface of the LB film is turned into $SiO_2$ by the action of the $O_2$ plasma, consequently providing passivity to oxygen; it is for this reason that only several layers of LB films will adequately withstand the $O_2$ plasma etching, when done through the primer organic film 42. Besides, since the LB film is a laminate of monomolecular films in principle, its thickness will become uniform, even if there are some irregularities in the primer coating (FIG. 6), so that the pattern may be formed uniform all over the surface and with a high accuracy. In FIG. 6, 52 represents hydrophobic part of the LB film reagent, while 54 indicates its hydrophilic part.

Thereafter, it is possible to subject the base substrate to etching, with this organic film pattern 50 as the etching resist. Although in this embodiment, as the LB film, there is illustrated negative type or a reagent which is polymerized by energy beam, to be sure, the same effects will be achieved with positive type.

This fifth embodiment is characterized by the process of forming the pattern in the sensitive LB film containing Si and, then, transferring this LB film pattern to the organic film, using $O_2$ plasma, which permits a great deal of cutback on the cycle of lamination, as compared with the resist of LB film only, leading to drastic improvement in productivity. Furthermore, even if there are some stepped parts on the base substrate, the film thickness may be always kept uniform, for high dimensional accuracy of the pattern and the number of pinholes produced is very small. All such particular features of the LB film are usable, enabling the resist pattern to be transferred to the organic film at a high accuracy, for great effects in the manufacture of VLSI where ultra-refining is required.

While specific embodiments of the invention have been illustrated and described herein, it is realized that modifications and changes will occur to those skilled in the art. It is, therefore, to be understood that the appended claims are intended to cover all modifications and changes as fall within the true spirit and scope of the invention.

What is claimed is:

1. A pattern forming method comprising:
   a step of forming on a substrate an energy responsive monomolecular film of a straight chain hydrocarbon having a terminal chlorosilane or silanol group at one end of the chain for bonding to the substrate, and a terminal vinyl, acetylene or cyano group at another end of the chain as responsive groups which undergo chemical reaction under irradiation by energy beams;

a step of deactivating the responsive groups in a pattern by irradiating energy beams in the pattern onto said responsive film; and a step of bonding a chemical reagent to the parts of said responsive film where the responsive groups remain.

2. The pattern forming method of claim 1, wherein said step of bonding the chemical reagent is repeated plural number of times, using as the chemical substance molecules having at one end thereof a group which tends to react with said responsive group and at the other end thereof a group which tends to perform the same function as said responsive group.

3. The pattern forming method of claim 1, wherein said responsive film is formed by the Langmuir-Blodgett technique or an adsorption process in such a manner that the responsive groups are juxtaposed on the substrate surface.

4. The pattern of forming method of claim 1, wherein substances containing Si are used as said chmical reagent.

5. The pattern forming method of claim 1, wherein said responsive groups which undergo chemical reaction under irradiation of energy beams include the vinyl group.

6. A pattern forming method comprising:

a step of forming on an arbitrary substrate an energy responsive monomolecular film of a straight chain hydrocarbon having a terminal chlorosilane or silanol group at one end of the chain for bonding to the substrate, and a terminal vinyl, acetylene or cyano group at another end of the chain as responsive groups which undergo chemical reaction under irradiation of energy beams;

a step of deactivating or activating the responsive groups in a pattern by irradiating energy beams in the pattern onto said responsive film; and a step of selectively combining a chemical reagent with the remaining parts, wherein a straight chain siloxane having chlorine combined at both ends thereof is used as the chemical reagent.

7. The pattern forming method of claim 6, wherein a substrate whose surface is hydrophobic is used, and the surface is rendered hydrophilic by means of plasma treatment, coating or adsorption of a surface active agent.

8. The pattern forming method of claim 6, wherein said responsive film is formed on an arbitrary substrate, interposed by an organic film, siloxane molecules are selectively bonded to surface parts of the responsive film and, thereafter, through treatment with oxygen plasma, the pattern formed of the siloxane molecules is transferred to the organic film.

9. The pattern forming method of claim 6 further comprising a step of replacing with hydroxyl group the chlorine at one end of each of the remaining siloxane molecules after the bonding reaction and a step of subjecting the hydroxyl groups to a bonding reaction with straight chain siloxane molecules having chlorine bonded at both ends thereof, which steps are performed more than once.

10. A pattern forming method comprising:

a step of forming an organic film on a substrate;

a step of forming on said organic film an energy responsive monomolecular film of a straight chain hydrocarbon having a terminal chlorosilane or silanol group at one end of the chain for bonding to the substrate, and a terminal vinyl, acetylene or cyano group at another end of the chain as responsive groups which undergo chemical reaction under irradiation of energy beams;

a step of deactivating said responsive groups in a pattern by irradiating energy beams onto the responsive film in a pattern;

a step of bonding a chemical reagent to parts of said responsive film where the responsive groups remain, said chemical reagent being resistant to etching by oxygen plasma and containing silicon; and a step of transferring said pattern to the organic film by subjecting said substrate to oxygen plasma treatment.

* * * * *